(12) United States Patent
Burda et al.

(10) Patent No.: US 8,588,951 B2
(45) Date of Patent: Nov. 19, 2013

(54) METHOD AND SYSTEM FOR SETTING RATES AND TARGETS IN A RANGE MANAGEMENT SYSTEM

(75) Inventors: Richard G. Burda, Pleasant Valley, NY (US); Aseem K. Joshi, Wappingers Falls, NY (US); Sameer T. Shikalgar, Wappingers Falls, NY (US); Susan Kangas Van Oss, Lagrangeville, NY (US); Patrick R. Varekamp, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/446,854

(22) Filed: Apr. 13, 2012

(65) Prior Publication Data

US 2012/0197423 A1  Aug. 2, 2012

Related U.S. Application Data

(63) Continuation of application No. 12/492,373, filed on Jun. 26, 2009, now Pat. No. 8,239,053, which is a continuation of application No. 11/393,029, filed on Mar. 30, 2006, now abandoned.

(51) Int. Cl.
*G06F 19/00* (2011.01)
(52) U.S. Cl.
USPC .............................. 700/100; 700/97; 700/99
(58) Field of Classification Search
USPC ...................................... 700/97, 99, 100, 101
See application file for complete search history.

(56) References Cited

U.S. PATENT DOCUMENTS

| | | | |
|---|---|---|---|
| 5,327,340 A | 7/1994 | Kaneko et al. |
| 5,479,343 A | 12/1995 | Matoba et al. |
| 5,536,128 A | 7/1996 | Shimoyashiro et al. |
| 5,946,661 A | 8/1999 | Rothschild et al. |
| 6,259,959 B1 | 7/2001 | Martin |
| 6,311,094 B1 | 10/2001 | Iriuchijima et al. |
| 6,564,113 B1 | 5/2003 | Barto et al. |
| 6,633,790 B2 | 10/2003 | Gartstein |
| 6,662,066 B1 | 12/2003 | Yu et al. |
| 6,725,113 B1 | 4/2004 | Barto et al. |
| 7,219,042 B2 | 5/2007 | Kobayashi et al. |
| 7,242,994 B2 | 7/2007 | Ishibashi et al. |
| 7,499,766 B2 | 3/2009 | Knight et al. |
| 2002/0002408 A1 | 1/2002 | Kobayashi et al. |
| 2002/0103559 A1 | 8/2002 | Gartstein |

OTHER PUBLICATIONS

Notice of Allowance dated May 2, 2012 in U.S. Appl. No. 12/492,373.
Shea et al., "Development and Implementation the Range Management System in a Multi-Flow Fabricator", IEEE/SEMI Advanced Semiconductor Manufacturing Conference 1997, pp. 398-404.

*Primary Examiner* — Charles Kasenge
(74) *Attorney, Agent, or Firm* — Matthew Zehrer; Roberts Mlotkowski Safran & Cole, P.C.

(57) ABSTRACT

A method and apparatus includes determining a number of planned starts of a product during a predetermined time period for future processing, averaging the number of planned starts for the predetermined time period, and setting a production rate for a first range based on the average number of planned starts.

13 Claims, 6 Drawing Sheets

METHOD AND SYSTEM FOR SETTING RATES AND TARGETS IN A RANGE MANAGEMENT SYSTEM

CROSS REFERENCE TO RELATED APPLICATIONS

This application is a continuation application of copending U.S. patent application Ser. No. 12/492,373 filed on Jun. 26, 2009, which is a continuation application of U.S. patent application Ser. No. 11/393,029 filed on Mar. 30, 2006, the contents of which are incorporated herein by reference in their entireties.

FIELD OF THE INVENTION

The invention relates to the manufacture of integrated circuits, and more particularly, to a system and method for controlling work in progress.

BACKGROUND DESCRIPTION

Semiconductor manufacturers are continually working to reduce time-to-market in an effort to improve serviceability while decreasing operating costs. Therefore, efforts have been made to develop and implement systems and methods such as continuous flow manufacturing, including operations management, which is also known as range management.

In a standard range management system, wafer processing operations are partitioned into a series of flows, where the products in each flow follow similar routings through the fabricator (fab). These flows are divided into ranges, where the expected cycle time of the work in progress (WIP) in each range is 24 hours. For example, a range may include the following operation sequence: lithography, metrology, overlay, and metrology CD.

In a range management system, each range has a daily takt rate (DTR) which is the ideal daily throughput rate for that range. Takt is a German word for "beat" and represents the pace at which product moves through the manufacturing process. In a standard range management scheme daily takt rates (DTRs) are static, changed infrequently, and set at a constant level across all ranges in a product flow.

Daily output targets for each range are set based on the DTR and also the amount of WIP in the range, and the amount of WIP in the next range. A standard range management matrix exists, that is used to determine the daily output targets. For example: the daily output target could be anywhere from zero, if the next range WIP is greater than 2.5× the DTR, to 1.25× the DTR if the next range WIP is lower than the DTR. When a range meets the target output for a day, the range is "stopped," so that effort can be directed towards other lots, in ranges that still need to achieve the target output. In a standard range management system, targets are set once per day.

At the end of each day, the performance of each range is evaluated and compared with the target to identify problem areas. By operating the manufacturing line with this methodology, the WIP stays balanced and resources are evenly distributed.

The evaluation of targets only once a day, though, can cause problems due to the movement of WIP within the day. The WIP profile changes frequently, such that, to ensure WIP balance, some stopped ranges may need to be activated and conversely, ranges that are delivering WIP into over-WIP ranges may need to be stopped so that resources can be applied to move other WIP into under-WIP ranges.

In existing range management schemes, WIP is driven to conform to a static DTR profile. For example, even though a certain product may only be ramping up, the DTR is set at a flat rate across all ranges. The result is that the WIP is forced quickly through certain ranges, because they seem to be under-WIP, and stopped in other ranges to divert resources. This does not reflect the commits, and ignores the capacity of different parts of the line. In such situations, WIP is driven at varying rates, but is not produced at committed rates.

Accordingly, there exists a need in the art to overcome the deficiencies and limitations described hereinabove.

BRIEF SUMMARY

In a first aspect of the invention, a method comprises determining a number of planned starts of a product during a predetermined time period for future processing, averaging the number of planned starts for the predetermined time period, and setting a production rate for a first range based on the average number of planned starts.

In another aspect of the invention, a system comprises a device configured to store current range matrix data, determine results based on the inputted current range matrix data, and update a production rate for at least a first range based on the results.

In another aspect of the invention, a computer program product comprising a computer useable medium including a computer readable program, wherein the computer readable program, when executed on a computer, causes the computer to determine a number of planned starts of a product during a predetermined future time period, average the number of planned starts for the predetermined future time period, and set a production rate for a first range based on the average number of planned starts.

DETAILED DESCRIPTION OF EMBODIMENTS OF THE INVENTION

The present invention provides a system and method for setting takt rates via production starts and capacity in a range management system. In the invention, for each range within a flow, takt rates are reflective of start rates, which are determined based on customer demands, product ramps, and capacity of the manufacturing process. Additionally, the daily output targets are reassessed periodically, in a preferred embodiment, every twelve hours. In embodiments, the updated daily output targets are automatically communicated to the real-time dispatching system, where the priority of lots is changed accordingly.

In today's dynamic manufacturing environment, production start profiles can change daily, or even more frequently. A dynamic takt rate, reflective of starts, could produce a noisy and erratic profile and add variability to the system. To prevent such an effect, the invention provides a damping system by setting takt rates to be the average of some previous period, for example, the previous week. The invention matches the frequency of takt rate changes to the frequency of the start profile changes (e.g. hourly, daily, weekly, or monthly).

Since the takt rates vary by range as well as by flow, the invention further provides a method to "move" the rates on a daily basis to match the movement of work in progress (WIP) through the manufacturing process. The invention therefore provides a fast, proactive, and automated mechanism to set takt rates for a complex, on-demand manufacturing environment.

Figure 1:
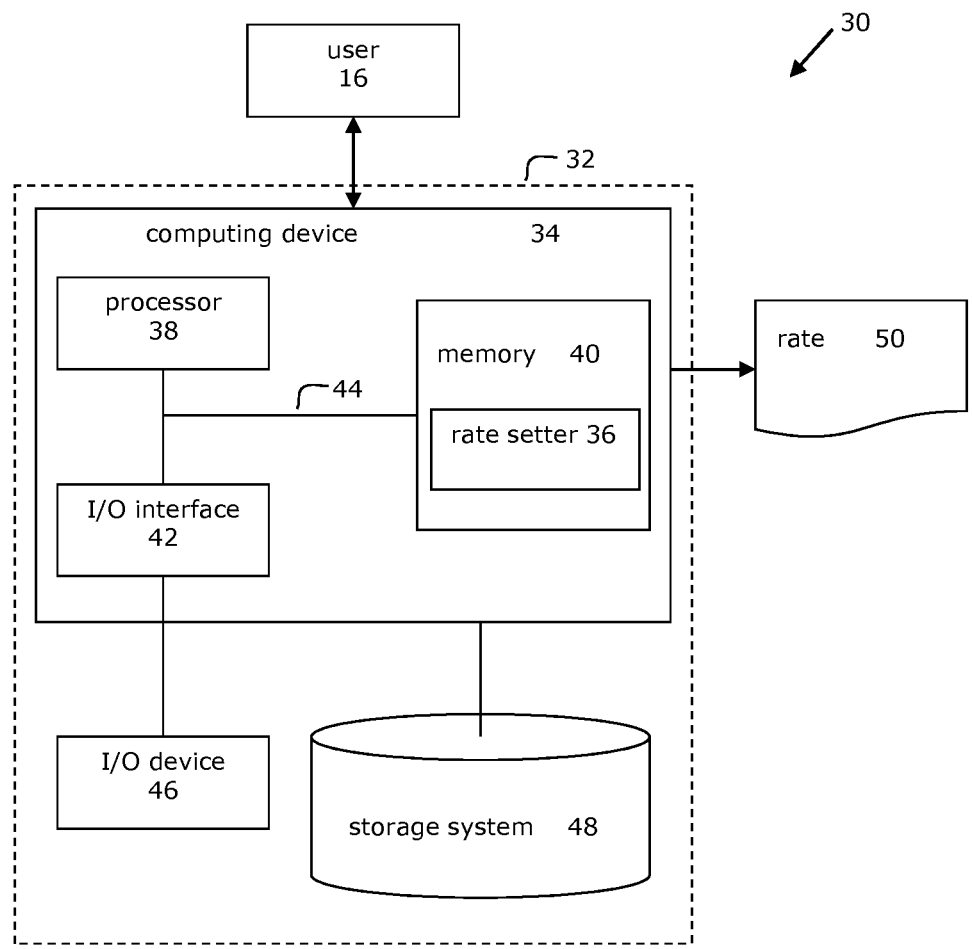
FIG. 1 shows an environment for implementing an aspect of the invention.

With reference to the accompanying drawings, FIG. 1 shows an illustrative environment 30 for managing the processes in accordance with the invention. To this extent, the environment 30 includes a computer infrastructure 32 that can perform the processes described herein. In particular, the computer infrastructure 32 is shown including a computing device 34 that comprises a rate setter 36, which makes computing device 34 operable to perform the processes described herein. The computing device 34 is shown including a processor 38, a memory 40, an input/output (I/O) interface 42, and a bus 44. Further, the computing device 34 is shown in communication with an external I/O device/resource 46 and a storage system 48. As is known in the art, in general, the processor 38 executes computer program code, which is stored in memory 40 and/or storage system 48. While executing computer program code, the processor 38 can read and/or write data, such as the rate 50, to/from memory 40, storage system 48, and/or I/O interface 42. The bus 44 provides a communications link between each of the components in the computing device 34. The I/O device 46 can comprise any device that enables an individual to interact with the computing device 34 or any device that enables the computing device 34 to communicate with one or more other computing devices using any type of communications link.

In any event, the computing device 34 can comprise any general purpose computing article of manufacture capable of executing computer program code installed thereon (e.g., a personal computer, server, handheld device, etc.). However, it is understood that the computing device 34 is only representative of various possible equivalent computing devices that may perform the processes described herein. To this extent, in other embodiments, the functionality provided by computing device 34 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 32 is only illustrative of various types of computer infrastructures for implementing the invention. For example, in one embodiment, the computer infrastructure 32 comprises two or more computing devices (e.g., a server cluster) that communicate over any type of communications link, such as a network, a shared memory, or the like, to perform the process described herein. Further, while performing the process described herein, one or more computing devices in the computer infrastructure 32 can communicate with one or more other computing devices external to computer infrastructure 32 using any type of communications link. In either case, the communications link can comprise any combination of various types of wired and/or wireless links; comprise any combination of one or more types of networks (e.g., the Internet, a wide area network, a local area network, a virtual private network, etc.); and/or utilize any combination of various types of transmission techniques and protocols. As discussed herein, the rate setter 36 enables computer infrastructure 32 to set the rate 50.

Figure 2:
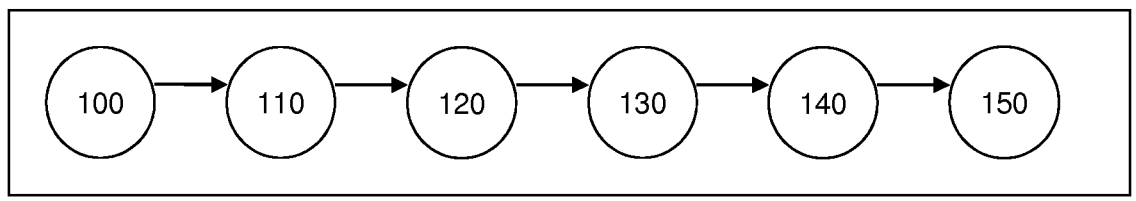
FIG. 2 is an illustrative example of the sequence of operations in a flow.

FIG. 2 is an illustrative example of the sequence of operations in a flow. In the figure, WIP moves along the flow, from left to right, as each operation is completed. For example, as a wafer moves through the fab, it will move from lithography 100, to metrology 110, to overlay 120, to metrology CD 130, etc. In this example, a first range might include only the operations 100-130, and a second range might include operations 140 and 150.

Figure 3:
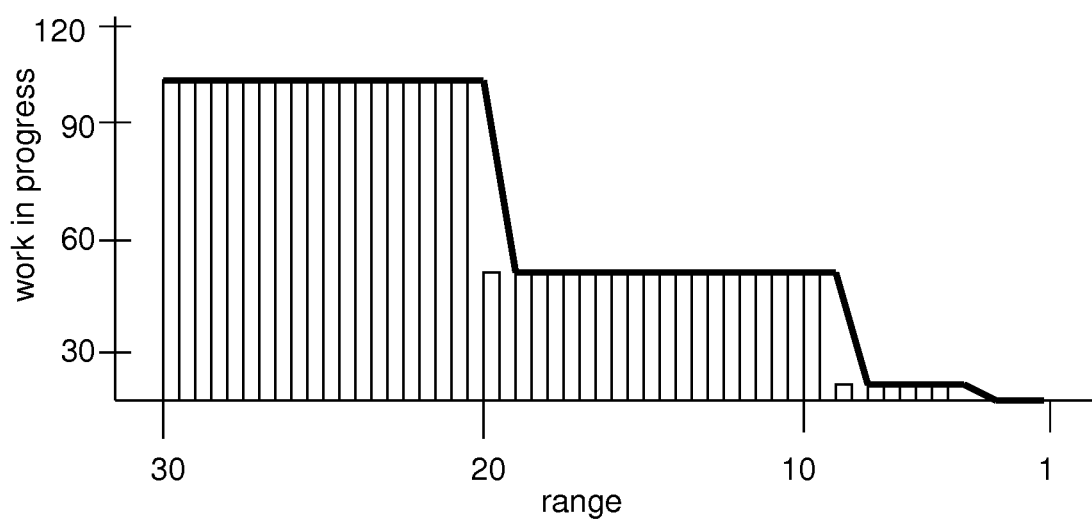
FIG. 3 is an illustrative example of the distribution of work in progress in ranges along a flow.

The present invention addresses the problem of static takt rates, by dynamically setting the takt rate based on the production starts, as shown in FIG. 3. That is, while production is ramping up, for example in range 1, the takt rate is set lower; but when production is up to speed, for example in range 25, the rate is set at capacity. In this manner, the performance of each range is assessed under more realistic goals, and the fab resources are more efficiently allocated.

Figure 4:
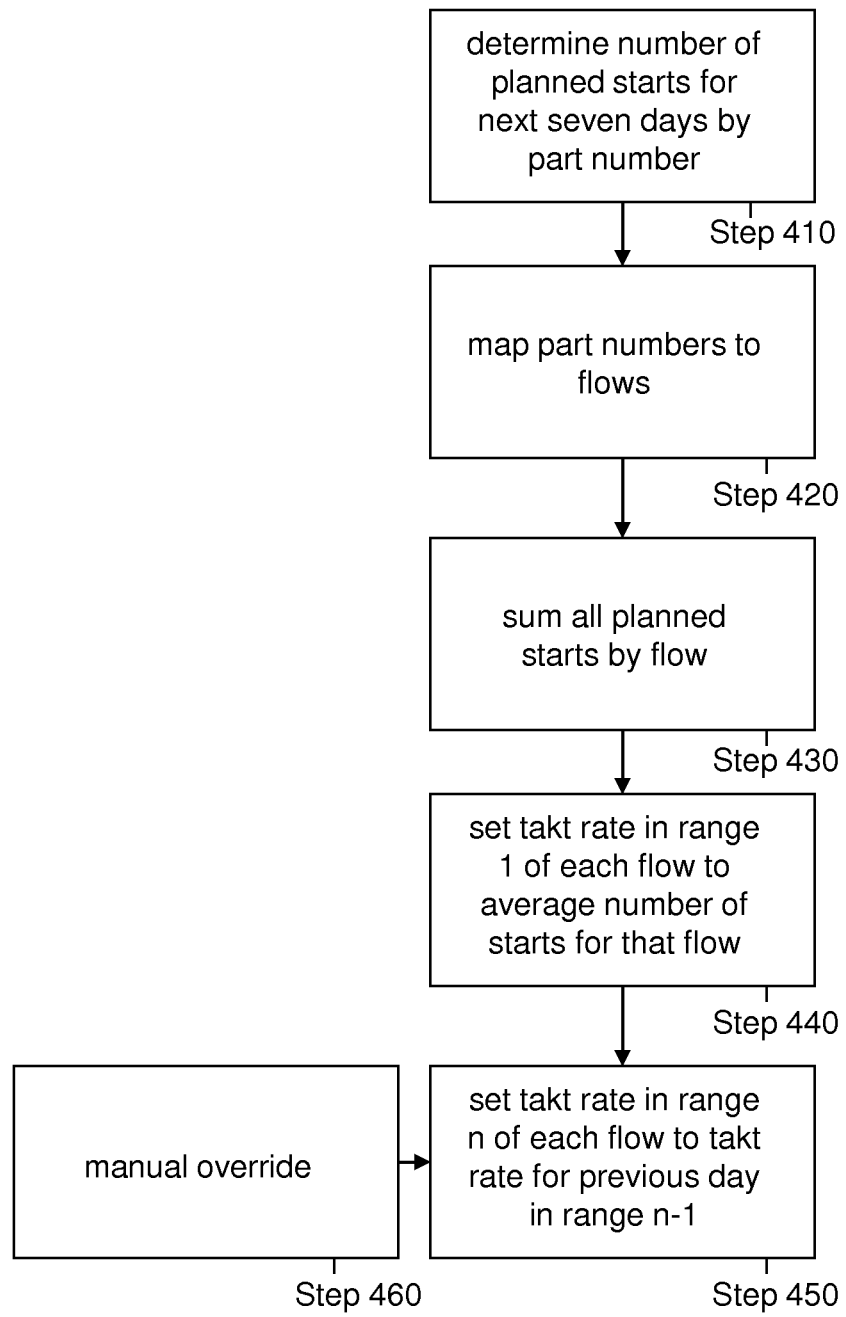
FIG. 4 is a flow chart illustrating steps in accordance with the invention.

FIG. 4 is a flow chart illustrating steps in accordance with the invention. The steps of FIG. 4 (as well as any other flows) may be representative of a high-level block diagram implementing the steps thereof. The present invention can take the form of an entirely hardware embodiment, an entirely software embodiment or an embodiment containing both hardware and software elements, or the invention can be executed entirely or partially manually. In a preferred embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk—read/write (CD-RW) and DVD.

In embodiments, at Step 410, the future starts are predicted. In this step, the number of planned starts for each part number is determined, for example, from a database. The number of planned starts will be for some future period, for example, in the next week. At Step 420, these part numbers are mapped to their corresponding range flows. That is, the number of starts is determined for each flow. At Step 430, all planned starts within each flow are summed. At Step 440, the rate in range 1 of each flow is set to the average number of starts for that flow. At Step 450, the rate in the nth range is set to the takt rate for the previous day in the (n−1)th range; this process is repeated for each range in the flow. If necessary, for example based on business needs, the takt rate may be set by manual override at Step 460. This process is repeated for each flow in the fab.

The following is an illustrative example of the present invention. Referring to the tables below, in Table 1, the average number of starts per week is calculated by part number for a particular week, e.g., the week of April 2002. In this step, the average calculated number for each part number is then assigned as the daily takt rate.

TABLE 1

| Part # | April 2002 | April 2003 | April 2004 | April 2005 | April 2006 | April 2007 | April 2008 | Average |
|---|---|---|---|---|---|---|---|---|
| AXXXX | 25 | 25 | 25 | 0 | 25 | 25 | 0 | 17.9 |
| BXXXX | 0 | 0 | 0 | 25 | 0 | 0 | 0 | 3.6 |
| CXXXX | 0 | 25 | 25 | 0 | 0 | 0 | 0 | 7.1 |
| DXXXX | 0 | 0 | 0 | 0 | 50 | 50 | 50 | 21.4 |
| EXXXX | 25 | 25 | 25 | 25 | 25 | 25 | 25 | 25.0 |
| FXXXX | 25 | 0 | 0 | 25 | 0 | 0 | 0 | 7.1 |
| GXXXX | 50 | 50 | 50 | 50 | 25 | 25 | 25 | 39.3 |

In Table 2, the part numbers are mapped to their respective flows, for example, part numbers AXXXX, BXXXX, and CXXXX are in flow ABC. Therefore, the number of starts for flow ABC is the sum (rounded up) of the starts for these part numbers.

TABLE 2

| | April 2002 | April 2003 | April 2004 | April 2005 | April 2006 | April 2007 | April 2008 |
|---|---|---|---|---|---|---|---|
| Flow ABC | 29 | 29 | 29 | 29 | 29 | 29 | 29 |
| Flow DEFG | 93 | 93 | 93 | 93 | 93 | 93 | 93 |

In Table 3, the takt rates are propagated daily towards the right. That is, for example, on day one, the takt rate for range 1 will be set to the average starts, but on day two, the takt rate for range two will be set to the takt rate of range 1 set on day one, etc.

TABLE 3

| | range | | | | | | |
|---|---|---|---|---|---|---|---|
| Flow ABC | 1 | 2 | 3 | 4 | 5 | 6 | 7 |
| day 1 | 29 | 30 | 30 | 30 | 30 | 30 | 30 |
| day 2 | 29 | 29 | 30 | 30 | 30 | 30 | 30 |

In Table 4, a user can manually override the takt rate for any range. This override (marked in the table with boxes) can persist until without further manual setting. In the example, the overrides propagate to the right daily, as any other takt rate does.

TABLE 4

| | range | | | | | | |
|---|---|---|---|---|---|---|---|
| Flow ABC | 1 | 2 | 3 | 4 | 5 | 6 | 7 |
| day 1 | 29 | 30 | 30 | 30 | 30 | 30 | 30 |
| day 2 | 29 | 29 | [45] | [45] | 30 | 30 | 30 |
| day 3 | 29 | 29 | 29 | [45] | [45] | 30 | 30 |
| day 4 | 29 | 29 | 29 | 29 | [45] | [45] | 30 |

The table below is an example of a range matrix in accordance with the present invention. In this matrix, DTR is the daily takt rate, RTR is the recovery takt rate (DTR plus 25%), and MTR is the minimum takt rate. For example, a snapshot of WIP is taken, and the range matrix is used to evaluate the range targets. If a range has been stopped, then the target is reevaluated after a period of time, for example, after twelve hours. If the WIP position has changed, as determined by the range matrix, then the range is assigned a target greater then zero. Since only half the day is remaining, the range target is based on WIP in the last half of the range, which is equivalent to half a day's cycle time. This sets a rate that is achievable in the remaining twelve hours.

| 1. If WIP in your customer's range is: | 2. And your WIP is: | |
|---|---|---|
| | =>RTR | <RTR |
| | 3. Then process: | 3. Then process: |
| <RTR | WIP in last half of range to RTR | WIP in last half of range to RTR |
| RTR to (2 × DTR) | WIP in last half of range to DTR | WIP in last half of range to DTR |
| (2 × DTR) to (2 × RTR) | WIP in last half of range to MTR | Stop. |
| >(2 × RTR) | Stop. | Stop. |

Similar logic is applied for a range that is not stopped at the time of the snapshot. For all ranges that are not stopped, the normal range matrix is used. If the range matrix produces a target of zero, no further output from the range is produced. Targets from all other ranges remain the same. The updated range targets are used to evaluate whether each range successfully met its target.

In the table above, the current WIP and the takt rates (DTR and RTR) are the data to be input, and updated daily targets are the outputs For example, if WIP in your customer's range is less than the recovery takt rate, and your WIP is greater than or equal to the recovery takt rate, the process WIP in the last half of the range, until the recovery takt rate is met.

Figure 5:
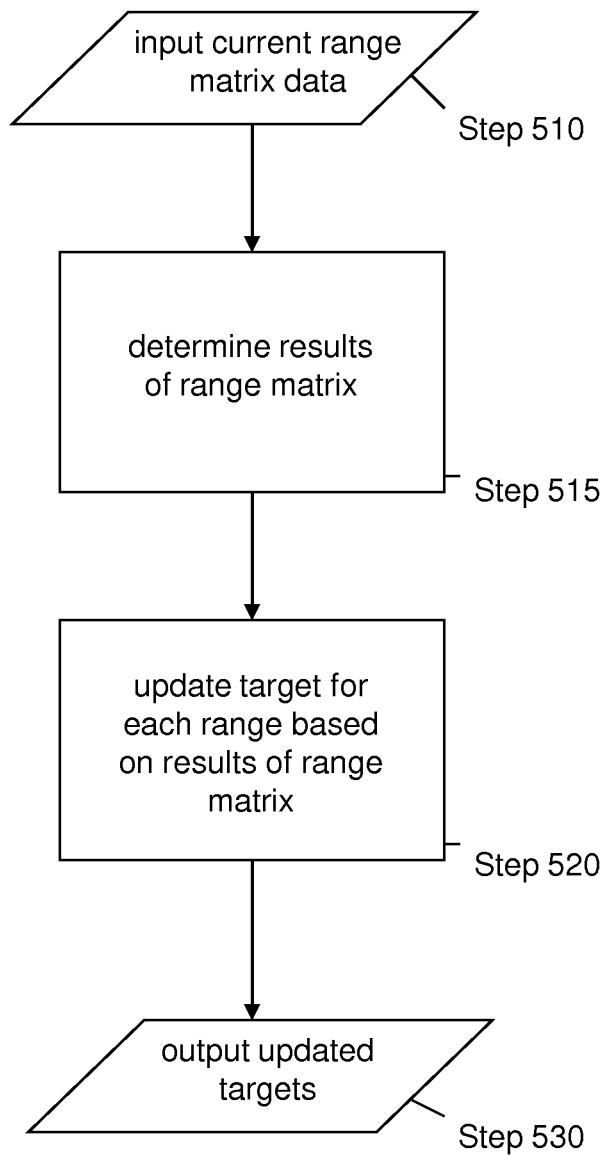
FIG. 5 is a flow chart illustrating steps in accordance with the invention.

FIG. 5 is a flow chart illustrating steps in accordance with the invention. In embodiments, at Step 510, existing range data is input. At Step 520, the daily target for each range is updated based on the results of the range matrix (e.g., see above table). At Step 530, the updated daily targets are output. This data may be output, for example, to a real-time dispatching system, whether automated or manually controlled, or to a range management system.

Figure 6:
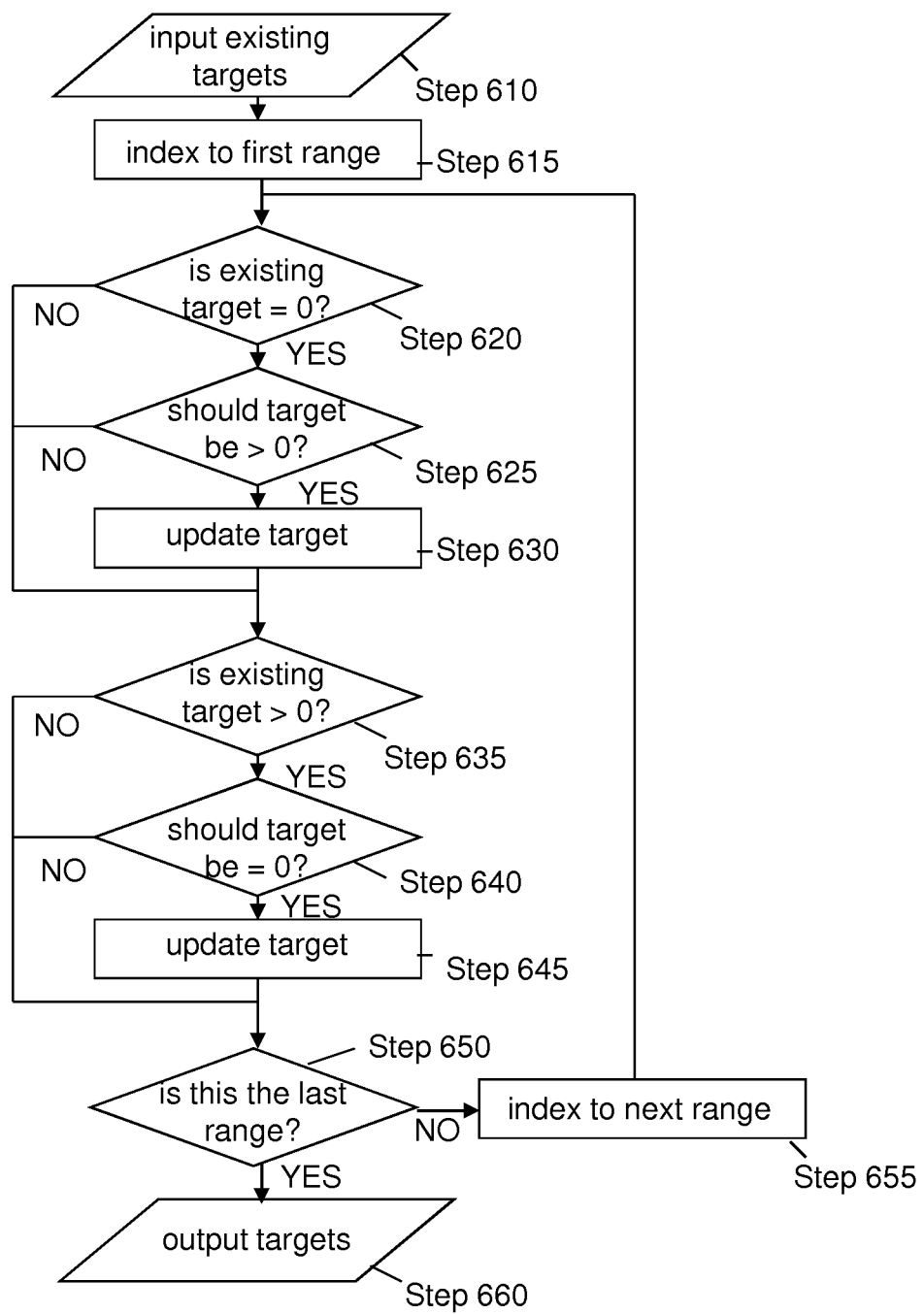
FIG. 6 is a flow chart illustrating steps in accordance with the invention.

FIG. 6 is a flow chart illustrating alternative steps in accordance with the invention. In effect, these steps query whether a range is stopped and should be restarted, or is running but should be stopped. This decision is based upon the current range matrix (shown in the above table) data. In embodiments, at Step 610, the existing targets are input for each range. At Step 615, the system is indexed to the first range. At Step 620, a determination is made as to whether the range under consideration is stopped, that is, whether the existing target is set at zero. If yes, then at Step 625, a determination is made as to whether, based on the current range matrix data, the range under consideration should be re-started. If yes, then at Step 630, the target is updated to re-start that range. If the answer to either of the preceding determinations is no, then at Step 635, a determination is made as to whether the range under consideration is not currently stopped, that is, whether the existing target is greater than zero. If yes, then at Step 640, a determination is made as to whether, based on the current range matrix data, the range under consideration should be stopped. If yes, then at Step 645, the target is updated to stop that range. If the answer to either of the preceding determinations is no, then at Step 650, a determination is made as to whether the range under consideration is the last range in that flow. If no, then at Step 655, the system is indexed to the next range, and the process is repeated from step 620. If yes, then at Step 660, the targets are output. As discussed above, this data may be output for example to a real-time dispatching system, whether automated or manually controlled, or to a range management system. The process is repeated periodically for all flows in the fab. For example, the process may be repeated every twelve hours. In this manner, the performance of each range is assessed more frequently, the variability of WIP is reduced, and the overall cycle time in the fab is improved.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed is:

1. A method, comprising:
   determining a number of planned starts of a product during a predetermined time period for future processing;
   averaging the number of planned starts for the predetermined time period;
   setting a first production rate for a first range based on the average number of planned starts using a processor;
   setting a second production rate for a second range based on the average number of planned starts; and
   propagating the first production rate of the first range to the second production rate for the second range;
   wherein the averaging the number of planned starts comprises averaging a number of starts for each range flow based on a sum of all starts for each range flow, and
   wherein the setting the first production rate for the first range comprises setting a takt rate for a first day in a first range of each range flow to the average number of starts for each range flow.

2. The method of claim 1, further comprising:
   propagating a takt rate for each range after the first range for each range flow; and
   setting a second takt rate for a second day in a second range for each range flow equal to the takt rate for the first day in the first range.

3. The method of claim 1, wherein:
   the determining the number of planned starts of the product comprises determining a number of planned starts for each part number of the product.

4. The method of claim 1, further comprising repeating the determining, averaging, and setting steps for a second predetermined time period in the future, wherein the second predetermined time period is a same amount of time as the predetermined time period.

5. The method of claim 1, wherein the predetermined time period is one week.

6. The method of claim 1, further comprising dynamically adjusting the first production rate for the first range based on the average number of planned starts, wherein the adjusting is provided on a predetermined schedule.

7. The method of claim 1, further comprising manually overriding the first production rate as provided in the step of setting the first production rate.

8. The method of claim 1, wherein the determining the number of planned starts comprises:
   mapping a plurality of part numbers to a corresponding one of the first range flow and the second range flow;
   determining a number of starts for each of the plurality of part numbers corresponding to each of the first range flow and the second range flow; and
   summing the determined number of starts for each of the first range flow and the second range flow.

9. The method of claim 8, wherein:
   the first range and the second range are comprised of operations included in a same sequence of operations comprising a flow, wherein the first range includes a first plurality of the operations and the second range is includes of a second, different plurality of the operations; and
   the predetermined time period is a calendar period of future production.

10. A The method comprising:
   determining a number of planned starts of a product during a predetermined time period for future processing;
   averaging the number of planned starts for the predetermined time period;
   setting a first production rate for a first range based on the average number of planned starts using a processor;
   setting a second production rate for a second range based on the average number of planned starts; and
   propagating the first production rate of the first range to the second production rate for the second range;
   wherein the second production rate of the second range is based on the first production rate within a previous time period; and
   the method further comprises repeating the determining, the averaging, and the setting steps for a second predetermined time period in the future.

11. The method of claim 10, further comprising dynamically adjusting the first production rate for the first range based on the average number of planned starts.

12. The method of claim 11, wherein:
   the second predetermined time period is a same amount of time as the predetermined time period; and
   the adjusting is provided on a predetermined schedule.

13. A computer program product comprising a computer useable storage memory including a computer readable program, wherein the computer readable program, when executed on a computer, causes the computer to:
   determine a number of planned starts of a product during a predetermined future time period;
   average the number of planned starts for the predetermined future time period;
   set a production rate for a first range based on the average number of planned starts;
   set a second production rate for a second range based on the average number of planned starts; and
   propagate the production rate of the first range to the second production rate for the second range
   wherein the averaging the number of planned starts comprises averaging a number of starts for each range flow based on a sum of all starts for each range flow, and
   wherein the setting the production rate for the first range comprises setting a takt rate for a first day in a first range of each range flow to the average number of starts for each range flow.

* * * * *